(12) United States Patent
Restle

(10) Patent No.: US 6,933,754 B2
(45) Date of Patent: Aug. 23, 2005

(54) CLOCK GATED POWER SUPPLY NOISE COMPENSATION

(75) Inventor: Phillip J. Restle, Katonah, NY (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 10/712,926

(22) Filed: Nov. 13, 2003

(65) Prior Publication Data

US 2005/0104646 A1 May 19, 2005

(51) Int. Cl.[7] .......................... H03K 5/153; H03L 7/00
(52) U.S. Cl. ........................ 327/77; 327/78; 327/143; 327/198
(58) Field of Search .............................. 327/77, 78, 79, 327/80, 81, 88, 143, 198, 291, 299

(56) References Cited

U.S. PATENT DOCUMENTS

| | | | |
|---|---|---|---|
| 5,369,311 A | * 11/1994 | Wang et al. ................. 327/292 |
| 5,513,358 A | * 4/1996 | Lundberg et al. ............ 713/330 |
| 5,561,389 A | * 10/1996 | Duley ........................ 327/143 |
| 6,006,025 A | 12/1999 | Cook et al. .................... 716/14 |
| 6,097,226 A | * 8/2000 | Kim ........................... 327/143 |
| 6,205,571 B1 | 3/2001 | Camporese et al. ........... 716/2 |
| 6,311,313 B1 | 10/2001 | Camporese et al. ........... 716/6 |
| 6,493,653 B1 | 12/2002 | Drinkard et al. ............. 702/176 |
| 6,504,414 B2 | 1/2003 | Saeki .......................... 327/291 |
| 6,621,311 B2 | * 9/2003 | Jeon .......................... 327/142 |
| 2003/0071679 A1 | * 4/2003 | Kono et al. ................. 327/538 |
| 2003/0108137 A1 | 6/2003 | Li et al. ...................... 375/371 |
| 2003/0120456 A1 | 6/2003 | Watson, Jr. et al. ......... 702/177 |

\* cited by examiner

*Primary Examiner*—Tuan T. Lam
(74) *Attorney, Agent, or Firm*—Law Office of Charles W. Peterson, Jr.; Louis J. Percello, Esq.; Satheesh K. Karra, Esq.

(57) ABSTRACT

A supply noise compensation circuit. The supply noise compensation circuit senses the onset of dI/dt noise events on a supply line and selectively gates off/forces on a chip clock to chip circuits.

29 Claims, 3 Drawing Sheets

CLOCK GATED POWER SUPPLY NOISE COMPENSATION

CROSS REFERENCE TO RELATED APPLICATION

The present invention is related to U.S. application Ser. No. 10/712,925 entitled "BUILT IN SELF TEST FOR MEASURING TOTAL TIMING UNCERTAINTY IN A DIGITAL DATA PATH" to Robert L. Franch et al., filed coincident herewith and assigned to the assignee of the present invention.

BACKGROUND OF THE INVENTION

1. Field of the Invention

The present invention is related to integrated circuit (IC) design systems and more particularly to characterizing timing uncertainties in ICs.

2. Background Description

Large high performance very large scale integration (VLSI) chips like microprocessors are synchronized to an internal clock. A typical internal clock is distributed throughout the chip, triggering chip registers to synchronously capture incoming data at the register latches and launch data from register latches. Ideally, each clock edge arrives simultaneously at each register every cycle and data arrives at the register latches sufficiently in advance of the respective clock edge, that all registers latch the correct data and simultaneously. Unfortunately, various chip differences can cause timing uncertainty, i.e., a variation in edge arrival to different registers.

Such timing uncertainties can arise from data propagation variations and/or from clock arrival variations. Data propagation variations, for example, may result in a capturing latch that randomly enters metastability or latches invalid data because the data may or may not arrive at its input with sufficient set up time. Clock edge arrival variations include, for example, clock frequency fluctuations (jitter) and/or register to register clock edge arrival variations (skew). Both data path and clock edge arrival variations can arise from a number of sources including, for example, ambient chip conditions (e.g., local temperature induced circuit variations or circuit heat sensitivities), power supply noise and chip process variations. In particular, power supply noise can cause clock propagation delay variations through clock distribution buffers. Such clock propagation delay variations can cause skew variations from clock edge arrival time uncertainty at the registers. Typically, chip process variations include device length variations with different device lengths at different points on the same chip. So, a buffer at one end of a chip may be faster than another identical (by design) buffer at the opposite end of the same chip. Especially for clock distribution buffers, these process variations are another source of timing uncertainty.

Furthermore, as technology features continue to shrink, power bus or $V_{dd}$ noise is becoming the dominant contributor to total timing uncertainty. High speed circuit switching may cause large, narrow current spikes with very rapid rise and fall times, i.e., large dI/dt. In particular, each of those current spikes cause substantial voltage spikes in the on-chip supply voltage, even when power supply inductance (L) is minimized. Because the voltage across the inductor is V=LdI/dt, these supply line spikes also are referred to as L dI/dt noise or, simply, dI/dt noise. Since current switching can vary from cycle to cycle, the resulting noise varies from cycle to cycle. When the $V_{dd}$ noise drops the on-chip supply voltage in response to a large switching event, it slows the entire chip, including both the clock path (clock buffers, local clock blocks, clock gating logic and etc.) as well as the data path logic (combinational logic gates, inverters and etc.) and may cause the chip to fail. When the noise dissipates and the on-chip supply later recovers, or even overshoots as the supply current falls; then, the circuits (buffers, gates and etc.) in these same paths speed up, returning to their nominal performance (with the normal stage delay) or even faster when the supply rises above nominal. If the supply rises too far above nominal, devices may be stressed beyond breaking to damage the chip or, at the very least reduce chip reliability. The number of stages that can complete changes as the data path slows down or speeds up relative to the clock path. Currently, in particular, such switching noise is a significant component of total timing uncertainty, comparable to skew or jitter (which are themselves affected by switching noise) or chip process variations.

Thus, it would be useful to be able to identify dI/dt noise as it occurs and minimize how it affects circuit performance.

SUMMARY OF THE INVENTION

It is a purpose of the invention to improve integrated circuit (IC) chip design;

It is another purpose of the invention to reduce dI/dt chip effects;

It is yet another purpose of the invention to simplify chip design requirements for dI/dt effects;

It is yet another purpose of the invention to sense the onset of dI/dt noise and take steps to minimize how it affects circuit performance.

The present invention relates to a supply noise compensation circuit. The supply noise compensation circuit senses the onset of dI/dt noise events on a supply line and selectively gates off/forces on a chip clock to chip circuits.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1A:
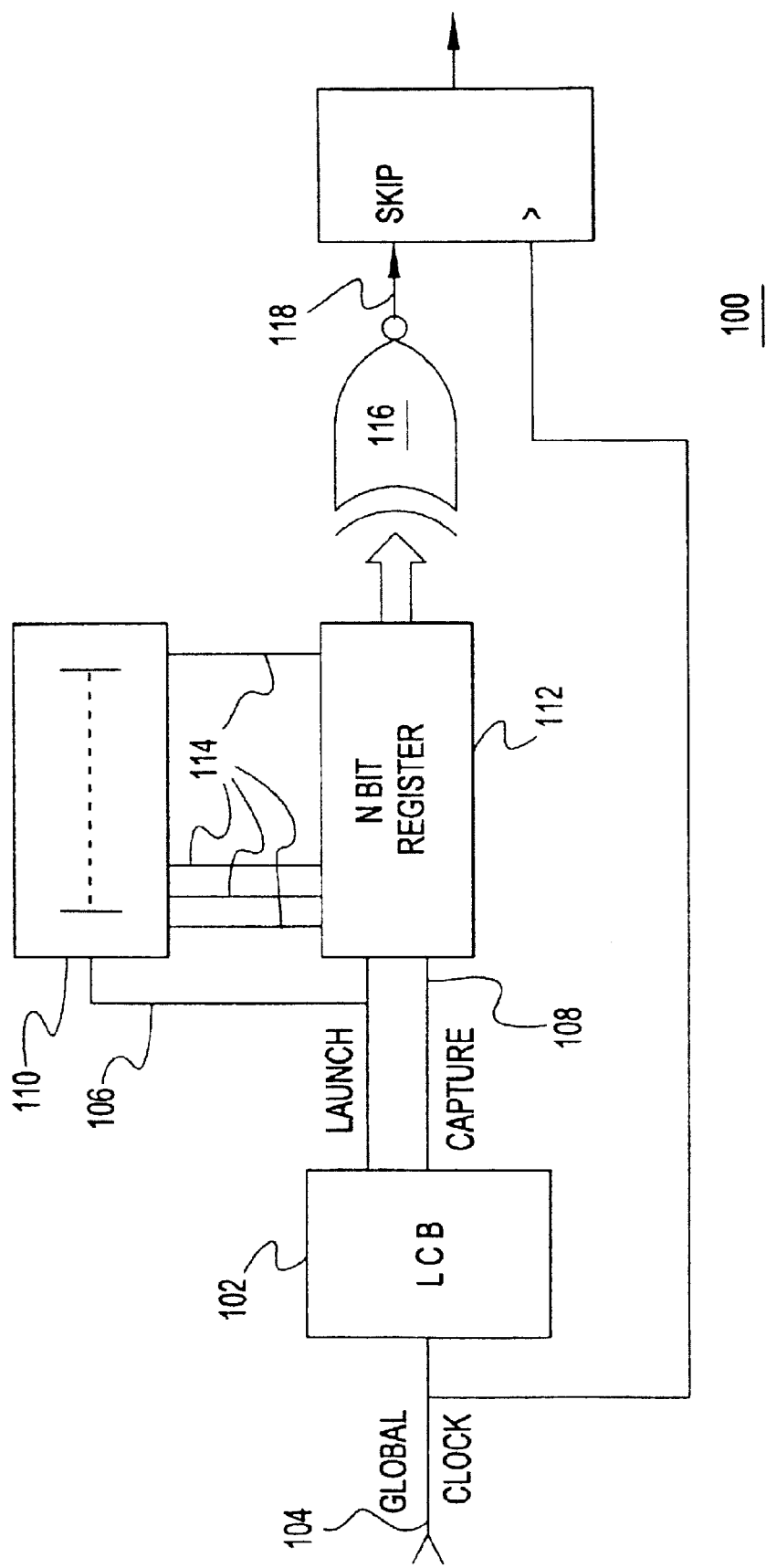
FIGS. 1A–C show a block diagram of an example of a supply noise compensation circuit according to a preferred embodiment of the present invention.
Figure 1B:
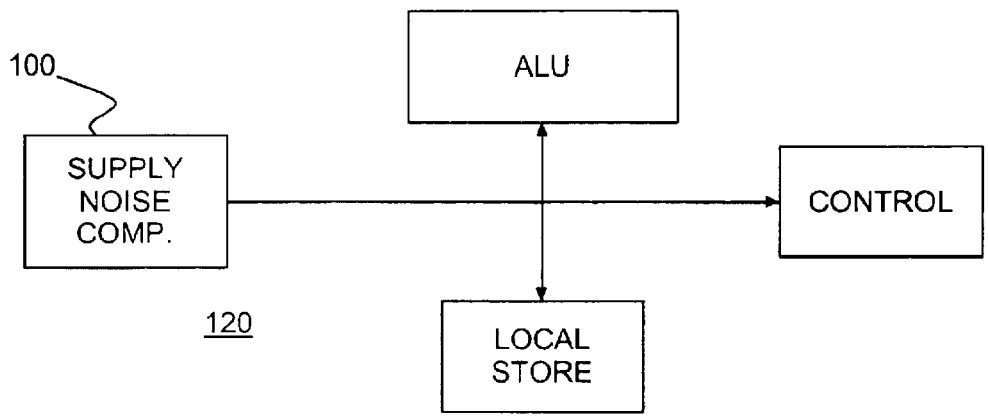
Figure 1C:
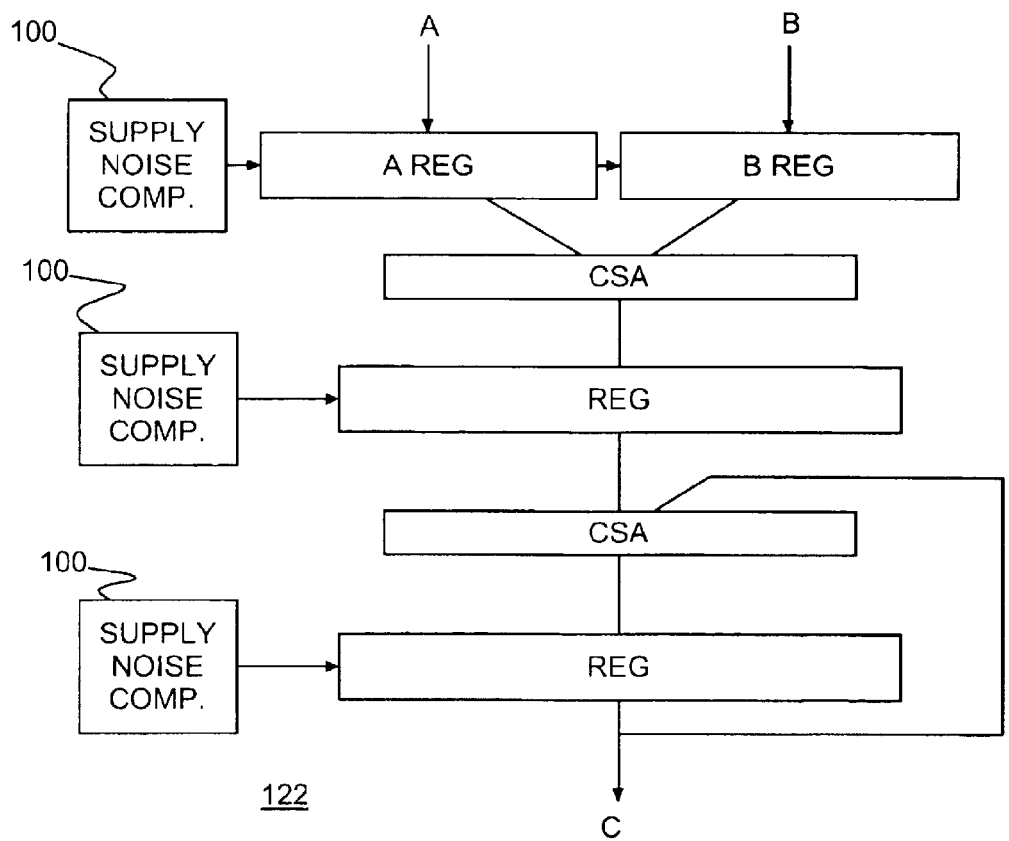

Turning now to the drawings and, more particularly, FIGS. 1A–C show block diagram examples of a supply noise compensation circuit 100 according to a preferred embodiment of the present invention. A local clock block (LCB) or clock buffer 102 receives and re-drives a global chip clock 104 into 2 complementary local clocks 106, 108. One clock, a launch clock 106, is provided as an input to a delay line 110 that is sensitive to supply voltage changes. The local clock, e.g., launch clock 106, enters the delay line 110 and, as it propagates through the delay line 110, the LCB 102 and delay line 110 mimic data propagation delay through an actual data path, e.g., in a microprocessor 122. In particular, the launch clock propagating along the delay line 110 reflects propagation delay variations resulting from switching or dI/dt noise on the Circuit power supply ($V_{dd}$) line. Both the launch clock 106 and the second clock, a capture clock 108, clock an N bit register 112. For example, N=129 may be convenient for holding 3 edges worth of clock edges. The N bit register 112 latches the state of the delay line 110 as reflected at delay line taps 114. Thus, in this example the capture clock 108 captures the forward position of the timing edges in the N bit register 112. Register contents are interrogated in compare circuit 116, which locates timing edges in the delay line 110 and identifies clock cycle to clock cycle delay changes, up or down. Thus, the delay line and register 112 act as a supply noise sensor. The output of the compare circuit 116 is an input to a clock skip circuit 118, which selectively throttles back on the clock, e.g., selectively skipping one or more clocks.

Although in this example, the launch clock 106 drives the delay line 110, either clock, the launch or the capture clock, can drive the delay line 110. In this example, the rising edge of launch clock 106 and the falling edge of the capture clock 108 (which latches the data) are coincident, and this edge of interest marks the end/start of the cycle boundary. It should be noted that the present invention is described herein with the registers (e.g., 112) being clocked by complementary clocks 106, 108. This is for example only and not intended as a limitation and the registers/latches may be pulsed latches or any suitable equivalent register/latch such as are well known in the art.

Preferably, the delay difference between each pair of taps 114 is equivalent to one logic block delay. Typically, the total timing uncertainty metric is the number of combinational logic stages that complete in a cycle, sometimes referred to as the fan-out of 4 (FO4) inverter count or FO4 number. However, for the best time resolution the preferred delay between delay line taps 114 is the minimum delay for the particular technology, e.g., the delay for a single fan-out (FO1) inverter or, for example 20 picoseconds (20 ps). Preferably also, the delay line 110 is at least three clock periods long with nominal supply voltage, i.e., long enough that the start of one clock cycle, the leading clock edge, has not propagated through the delay line 110 before the start of second following cycle enters the delay line 110. Therefore, preferably, in the absence of noise the delay line 110 has 3 edges passing through it. The N bit register 112 is clocked by both the launch clock 106 and the capture clock 108. Essentially, at the start of a global clock period, the launch clock 106 passes a previously loaded N bits out of the register 112 as the leading edge begins traversing the delay line 110. At the end of each global clock period, the capture clock 108 latches the state of the delay line taps 114 in the capture register 112, capturing the progress of the launch clock 106 edges through the delay line 110. The captured edges are at evenly spaced taps 114 in the absence of dI/dt noise other sources of timing uncertainty and such other sources may cause a variation of a couple of taps 114. However, upon the occurrence of dI/dt noise, the edge locations may be much more closely spaced when the supply voltage spikes negative (below $V_{dd}$) because the delay line is slower and much more widely spaced when the supply is rebounding (above $V_{dd}$).

The delay line 110 may be a series of suitably loaded inverters with delay line taps 114 being the inverter outputs, for example. As a result, the taps 114 alternate ones and zeros and the clock edges are located by a matched pair (either 2 zeros in a row, or 2 ones in a row) of adjacent delay line taps 114. The space between matching tap pairs, e.g., 60 inverter stages or 1.2 nanoseconds (1.2 ns for 20 ps inverters) between leading/rising clock edges for 3 clock edges traversing a 128 tap delay line 110, is a measure of logic propagation during a complete clock cycle. Thus, essentially, the same local clock block 102 both launches and captures the timing edges and; because the local clock itself is the launched data, the clock takes a snapshot of itself in the capturing latches.

Jitter from a phase locked loop (PLL), for example, may cause as much as a few occasional short cycles in a row. Although not required, the circuit timing can be adjusted so that the first edge (e.g., a leading or rising edge) is always captured in bit position 0 (register latch 0) and in the absence of jitter, the second (leading) edge is in bit 60 and the third in bit position 120. Without clock timing uncertainty, the edges always fall in the same positions, 0, 60, 120. However, with an occasional short cycle the second edge (for the shorter cycle) shifts by one to bit 59; the third edge is captured in bit 119. With 2 consecutive short cycles, however, the second edge still shifts to bit 59, but the third edge shifts to bit 118. In each example, the short clock is no more than a single delay shorter/longer than its neighbors.

Figure 2:
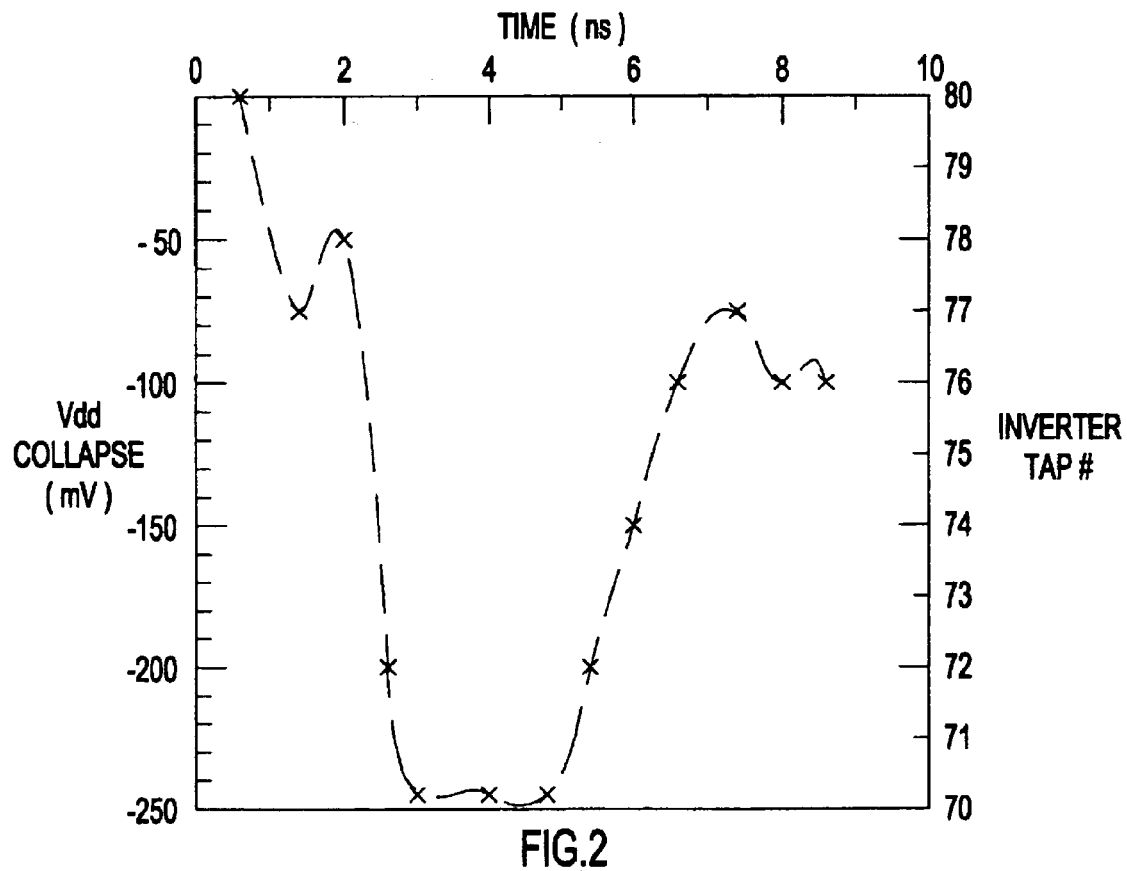
FIG. 2 shows dI/dt noise in a supply line.

FIG. 2 shows an example of a section of a supply noise characterization plot 120 showing dI/dt noise in a supply line, which may be characterized as described in U.S. application Ser. No. 10/712,925 (Attorney Docket No. YOR920030363US1) entitled "BUILT IN SELF TEST FOR MEASURING TOTAL TIMING UNCERTAINTY IN A DIGITAL DATA PATH" to Robert L. Franch et al., filed coincident herewith, assigned to the assignee of the present invention and incorporated herein by reference. Upon the occurrence of a dI/dt noise spike, which typically lasts several clock cycles (e.g., anywhere from 10–50 cycles), the noise spike drives the supply to the delay line inverters 110 below nominal, reducing inverter switching speed and increasing inverter propagation delay, 2–3 register bits at about 2 ns in this example 120. By the end of the next cycle at about 3.6 ns in this example, the delay line slows such that the preceding edges have propagated 10 fewer stages. Also, it should be noted that the present invention has application to measurement results as described in Franch et al. and such measurements may be used to sense the onset of a dI/dt noise event to mitigate the effects of such an event in accordance with the present invention.

So for this example, instead of edges being captured at register bit locations 1, 60 and 120, by the end of the first cycle, edges are captured edges are at register bit locations 1, 58 and 116 because the noise spike slows both edges. Further, by the end of the second cycle, captured edges are at register bit locations 1, 50 and 108. Similarly, as the current responsible for the noise spike begins to fall, the supply voltage spikes positive, accelerating edge travel through delay line 110 to the point where only 2 edges (in this example) are propagating through delay line 110. A preferred embodiment integrated circuit (IC) or IC with a supply noise compensation circuit (e.g., 100 in FIGS. 1A–C) senses the onset of dI/dt noise and responds by selectively skipping/forcing clock cycles to mitigate the dI/dt noise spikes and so, the extreme effects of dI/dt noise spikes.

So referring again to FIGS. 1A–C, when the compare 116 identifies at least a 2 bit position reduction between cycles, for example, the compare 116 sends a signal to skip control circuit 118 to block the clock for at least the next cycle. Optionally, in addition whenever, the compare 116 identifies at least a 2 bit position increase between cycles, for example, the compare 116 sends a signal to skip control circuit 118 to force the clock for at least the next cycle, i.e., preventing clock blocking for at least the next cycle. Furthermore, a single supply noise compensation circuit 100 may be located at the beginning of the chip clock tree as in the example 120 of FIG. 1B, throttling the whole chip down/up in response to dI/dt noise or, supply noise compensation circuits 100 may be distributed throughout the chip clock tree as shown in the pipelined example 122 of FIG. 1C selectively throttling portions of the chip down/up in response to localized dI/dt noise.

In particular, for a complex pipelined IC such as a microprocessor 122 where chip units or blocks of logic may use localized power up/down techniques, a local supply noise compensation circuit 100 may be provided with the chip units. Each local supply noise compensation circuit 100 may selectively delay powering up/down to better distribute instantaneous chip supply demands and, thereby, reduce dI/dt noise. Also, skip driver 118 may be selected to block/force cycles until the event has subsided partially or completely (e.g., an AND of the output of compare circuit 116 with the global clock), to block/force alternate cycles or any combination thereof.

Figure 3:
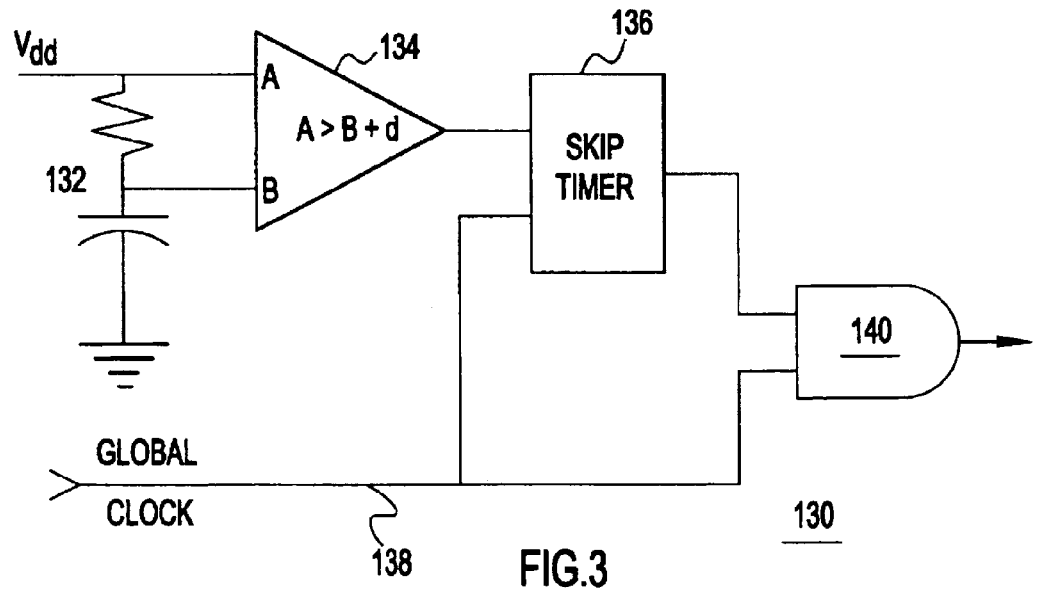
FIG. 3 shows a noise compensation circuit with a simple voltage sense sensing dI/dt spikes.

Further, a simple voltage sense may be used to sense dI/dt spikes as shown in the noise compensation circuit 130 example of FIG. 3, instead of delay line 110 and register 112 of the example 100 of FIGS. 1A–B. In this example, supply voltage is averaged with in an RC filter 132 and compared in voltage compare 134. A skip timer 136, e.g., a simple D-type latch, is synchronized to global clock 138 and selectively block/passes the global clock in AND gate 138. When the instantaneous supply voltage to voltage compare circuit 134 is below the average voltage at RC filter 132 by a minimum instantaneous voltage difference (d), the voltage compare circuit 134 indicates the occurrence of dI/dt noise. Upon receipt of the indication, the skip timer 136 send a block signal synchronized to global clock 138 to the AND gate 140 that blocks at least the next clock cycle. The skip timer 136 prevents spurious local clocks from occurring, e.g., from a change in the voltage compare 134 mid cycle.

Thus, advantageously, a preferred embodiment IC can sense the onset of dI/dt noise and avoid the potentially disastrous effects on IC units and even mitigate the dI/dt noise spike itself.

While the invention has been described in terms of preferred embodiments, those skilled in the art will recognize that the invention can be practiced with modification within the spirit and scope of the appended claims.

What is claimed is:

1. A supply noise compensation circuit comprising:
   supply noise sensing means for sensing the onset of noise events on a supply line;
   means for synchronizing a clock skip signal from said supply noise sensing means to a chip clock; and
   clock gating means for selectively gating said chip clock responsive to a synchronized said clock skip signal, said clock gating means selectively gating off/forcing on said chip clock to chip circuits.

2. A supply noise compensation circuit as in claim 1 wherein said supply noise sensing means comprises:
   a local clock buffer receiving said chip clock and providing a local clock;
   a delay line receiving said local clock, said local clock propagating along said delay line, supply line noise affecting propagation of said clock along said delay line; and
   a register latching delay line tap contents responsive to said local clock, latched tap locations indicating propagation of said clock in said delay line.

3. A supply noise compensation circuit as in claim 2 wherein said delay line is at least 3 global clock cycles long.

4. A supply noise compensation circuit as in claim 3 wherein said delay line taps are evenly spaced along said delay line and a clock edge in said delay line is identified by a matched state at a pair of adjacent said delay line taps.

5. A supply noise compensation circuit as in claim 3 wherein said local clock is a pair of complementary clock phases.

6. A supply noise compensation circuit as in claim 3 wherein said delay line is a number (N) of series connected inverters.

7. A supply noise compensation circuit as in claim 6 wherein said register is an N bit register, each bit receiving an output of one of said series connected inverters.

8. A supply noise compensation circuit as in claim 3 wherein said sensing means further comprises a compare comparing adjacent bits in said register, identifying a change in timing edge spacing and providing a skip signal.

9. A supply noise compensation circuit as in claim 8 wherein said clock gating means receives said skip signal and selectively passes said chip clock responsive to said skip signal.

10. A supply noise compensation circuit as in claim 9 wherein said clock gating means selectively prevents pausing distribution of said chip clock responsive to said skip signal, thereby forcing presentation of said on chip clock to respective said chip clock circuits.

11. A suppy noise compensation circuit as in claim 9 wherein said synchronizing means comprises said register and said clock gating means.

12. A supply noise compensation circuit as in claim 1 wherein said supply noise sensing means comprises:
   means for averaging supply line voltage; and
   means for comparing instantaneous said supply line voltage against an average said supply line voltage.

13. A supply noise compensation circuit as in claim 1 wherein said means for synchronizing comprises a latch.

14. A supply noise compensation circuit as in claim 12 wherein said clock gating means is an AND gate ANDing a compare output from said means for comparing and said chip clock, an output of said AND gate being a gated clock.

15. A supply noise compensation circuit as in claim 1 wherein said noise events are dI/dt noise events.

16. An integrated circuit (IC) chip having a plurality of functional units distributed on said chip and in communication with each other, each of said functional units being supplied by a common voltage supply, said IC chip further including at least one supply noise compensation circuit sensing the onset of dI/dt noise events on said common voltage supply and selectively, synchronously gating a chip clock to at least one chip circuit in at least one chip unit, said supply noise compensation circuit comprising:
   a delay line receiving a local clock, said local clock propagating along said delay line, supply line noise affecting propagation of said clock along said delay line;
   a register latching delay line tap contents responsive to said local clock, latched tap locations indicating propagation of said clock in said delay line;
   a compare comparing adjacent bits in said register and identifying a change in timing edge spacing and providing a clock skip signal; and
   a clock skip circuit selectively gating said chip clock responsive to a said clock skip signal.

17. An IC chip as in claim 16, said supply noise compensation circuit further comprising:

a local clock buffer receiving said chip clock and providing a local clock.

18. An IC chip as in claim 17 wherein said local clock is a pair of complementary clock phases.

19. An IC chip as in claim 16 wherein delay line taps are evenly spaced along said delay line and a clock edge in said delay line is identified by a matched state at a pair of adjacent said delay line taps.

20. An IC chip as in claim 16 wherein said delay line is a number (N) of series connected inverters, nominal delay through said inverters being at least 3 clock cycles long.

21. An IC chip as in claim 20 wherein said register is an N bit register, each bit receiving an output of one of said series connected inverters.

22. An IC chip as in claim 16 wherein said clock skip circuit selectively prevents pausing distribution of said chip clock responsive to said skip signal, thereby forcing presentation of said on chip clock to respective said chip clock circuits.

23. An IC chips as in claim 16 wherein said at least one noise compensation circuit is a plurality of noise compensation circuits, each gating a global clock to a respective one of said units.

24. An integrated circuit (IC) chip, having a plurality of functional units distributed on said chip and in communication with each other, each of said functional units being supplied by a common voltage supply, said IC chip further including at least one supply noise compensation circuit sensing the onset of dI/dt noise events on said common voltage supply and selectively, synchronously gating a chip clock to at least one chip circuit in at least one chip unit, said supply noise compensation circuit comprising:

an RC filter averaging supply line voltage;

a comparator comparing instantaneous said supply line voltage against an average said supply line voltage; and an AND gate gating said chip clock responsive to said comparator.

25. An integrated circuit (IC) chip having a plurality of functional units distributed on said chip and in communication with each other, each of said functional units being supplied by a common voltage supply, said IC chip further including at least one supply noise compensation circuit sensing the onset of dI/dt noise events on said common voltage supply and selectively gating a chip clock to at least one chip circuit in at least one chip unit, said supply noise compensation circuit comprising:

a local clock buffer receiving said chip clock and providing a local clock;

a delay line receiving a local clock, said local clock propagating along said delay line, supply line noise affecting propagation of said clock along said delay line, nominal delay through said inverters being at least 3 clock cycles long;

an N bit register latching delay line tap contents responsive to said local clock, latched tap locations indicating propagation of said clock in said delay line;

a compare comparing adjacent bits in said register and identifying a change in timing edge spacing and providing a clock skip signal; and a clock skip circuit selectively gating said chip clock responsive to a said clock skip signal.

26. An IC chip as in claim 25 wherein said delay line is N series connected inverters, each inverter output being a delay line tap and a clock edge in said delay line being identified by a matched state at a pair of adjacent delay line taps.

27. An IC chip as in claim 26 wherein said clock skip circuit selectively prevents pausing distribution of said chip clock responsive to said skip signal, thereby forcing presentation of said on chip clock to respective said chip clock circuits.

28. An IC chip as in claim 27 wherein said local clock is a pair of complementary clock phases.

29. An IC chip as in claim 28 wherein said at least one noise compensation circuit is a plurality of noise compensation circuits, each gating a global clock to a respective one of said units.

* * * * *